(12) United States Patent
Cho et al.

(10) Patent No.: US 12,733,141 B2
(45) Date of Patent: Sep. 8, 2026

(54) DISPLAY DEVICE

(71) Applicant: SAMSUNG ELECTRONICS CO., LTD., Suwon-si (KR)

(72) Inventors: Jinhyun Cho, Suwon-si (KR); Pilyong Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 499 days.

(21) Appl. No.: 18/118,508

(22) Filed: Mar. 7, 2023

(65) Prior Publication Data

US 2023/0238500 A1 Jul. 27, 2023

Related U.S. Application Data

(63) Continuation of application No. PCT/KR2021/010697, filed on Aug. 12, 2021.

(30) Foreign Application Priority Data

Oct. 7, 2020 (KR) ........................ 10-2020-0129471

(51) Int. Cl.
*H05K 7/20* (2006.01)
*G09F 9/302* (2006.01)
(Continued)

(52) U.S. Cl.
CPC ....... *H05K 7/20963* (2013.01); *G09F 9/3026* (2013.01); *G09F 9/33* (2013.01);
(Continued)

(58) Field of Classification Search
CPC ............. H05K 7/20963; H05K 7/2039; H05K 7/20509; H05K 7/20954; G09F 9/3026; G09F 9/33; H10H 20/8581; H10H 29/142
See application file for complete search history.

(56) References Cited

U.S. PATENT DOCUMENTS 8,104,912 B2 1/2012 Park
9,081,552 B1 7/2015 Hall
(Continued)

FOREIGN PATENT DOCUMENTS

JP 6-17168 Y2 5/1994
JP 8-211831 A 8/1996
(Continued)

OTHER PUBLICATIONS

Sung KR20170131137A Translation.*
(Continued)

*Primary Examiner* — Jacob R Crum
(74) *Attorney, Agent, or Firm* — Sughrue Mion, PLLC

(57) ABSTRACT

According to the present inventive concept, a display device includes a display panel in which a plurality of display modules are horizontally aligned in an M*N matrix, wherein each of the plurality of display modules includes: a mounting surface on which a plurality of inorganic light-emitting elements are mounted; a substrate including a back surface disposed opposite to the mounting surface; and a module heat-dissipation member in contact with the back surface of the substrate to dissipate heat generated in the substrate, wherein the display panel includes a panel heat-dissipation member which connects the respective module heat-dissipation members so as to dissipate heat between the respective module heat-dissipation members of the plurality of display modules.

14 Claims, 8 Drawing Sheets

(51) Int. Cl.
*G09F 9/33* (2006.01)
*H10H 20/858* (2025.01)
*H10H 29/14* (2025.01)

(52) U.S. Cl.
CPC ....... *H05K 7/2039* (2013.01); *H05K 7/20509* (2013.01); *H05K 7/20954* (2013.01); *H10H 20/8581* (2025.01); *H10H 29/142* (2025.01)

(56) References Cited

U.S. PATENT DOCUMENTS

| | | | | |
|---|---|---|---|---|
| 9,414,503 | B2 * | 8/2016 | Lee | G09F 9/3026 |
| 9,639,127 | B2 | 5/2017 | Kim | |
| 9,916,782 | B2 | 3/2018 | Hall | |
| 10,410,552 | B2 | 9/2019 | Hall | |
| 10,741,107 | B2 | 8/2020 | Hall | |
| 2009/0190353 | A1 | 7/2009 | Barker | |
| 2010/0156763 | A1 * | 6/2010 | Lee | H10K 59/8794 345/76 |
| 2011/0176293 | A1 * | 7/2011 | Park | F21K 9/00 362/249.02 |
| 2015/0169277 | A1 | 6/2015 | Kim et al. | |
| 2016/0179453 | A1 * | 6/2016 | Jepsen | G06F 3/1446 345/1.3 |
| 2016/0267820 | A1 | 9/2016 | Hall | |
| 2017/0277219 | A1 * | 9/2017 | Chung | H04N 23/57 |
| 2019/0116697 | A1 * | 4/2019 | Wu | F28D 15/0233 |
| 2020/0185453 | A1 | 6/2020 | Cho et al. | |
| 2021/0043801 | A1 | 2/2021 | Lee et al. | |
| 2021/0307213 | A1 | 9/2021 | Kim et al. | |
| 2022/0247147 | A1 * | 8/2022 | Cheng | H01S 5/02469 |

FOREIGN PATENT DOCUMENTS

| | | | |
|---|---|---|---|
| JP | 2003-15532 | A | 1/2003 |
| JP | 5868161 | B2 | 2/2016 |
| JP | 2018-85495 | A | 5/2018 |
| KR | 10-2008-0016787 | A | 2/2008 |
| KR | 10-0930376 | B1 | 12/2009 |
| KR | 10-2011-0086648 | A | 7/2011 |
| KR | 10-1402177 | B1 | 6/2014 |
| KR | 10-2015-0071092 | A | 6/2015 |
| KR | 10-2015-0127473 | A | 11/2015 |
| KR | 10-1734964 | B1 | 5/2017 |
| KR | 10-2017-0115408 | A | 10/2017 |
| KR | 10-2017-0131137 | A | 11/2017 |
| KR | 10-2020-0016487 | A | 2/2020 |
| KR | 10-2020-0061604 | A | 6/2020 |
| KR | 10-2021-0017498 | A | 2/2021 |

OTHER PUBLICATIONS

Search Report (PCT/ISA/210) issued Nov. 23, 2021 by the International Searching Authority for International Patent Application No. PCT/KR2021/010697.

Written Opinion (PCT/ISA/237) issued Nov. 23, 2021 by the International Searching Authority for International Patent Application No. PCT/KR2021/010697.

Communication issued on Feb. 7, 2025 from the Korean Intellectual Property Office for Korean Patent Application No. 10-2020-0129471.

Communication issued Oct. 24, 2025 by the Korean Intellectual Property Office in counterpart Korean Patent Application No. 10-2020-0129471.

* cited by examiner

DISPLAY DEVICE

CROSS-REFERENCE TO RELATED APPLICATION(S)

This application is a Bypass Continuation Application of PCT International Application No. PCT/KR2021/010697, filed on Aug. 12, 2021, which is based on and claims priority to Korean Patent Application No. 10-2020-0129471, filed on Oct. 7, 2020, in the Korean Intellectual Property Office, the disclosure of which are incorporated by reference herein in their entireties

BACKGROUND

The disclosure relates to a display device capable of displaying an image by combining modules in which an inorganic light emitting device that is self-luminous is mounted on a substrate.

A display device is a type of an output device that visually displays data information such as characters and figures, and images.

In general, a display device has mainly used a liquid crystal panel that requires a backlight or an organic light-emitting diode (OLED) panel provided with a film of an organic compound that emits light by itself in response to an electric current. However, the liquid crystal panel has difficulties such as a slow-response time, and high-power consumption, and further it is difficult to make the liquid crystal panel compact because the liquid crystal panel does not emit light by itself, and requires a backlight. In addition, because the OLED panel emit light by itself, the OLED panel does not require a backlight, and thus it is possible to make the OLED panel thin. However, the OLED panel is susceptible to screen burn-in. The screen burn-in is a phenomenon in which, if the same screen is displayed for a long time, the lifetime of the sub-pixels expires and the previous screen remains the same even when the screen is changed.

Accordingly, a micro light emitting diode (micro-LED or μLED) display panel that mounts an inorganic light emitting device on a substrate and uses the inorganic light emitting device itself as a pixel has been studied as a new panel to replace the OLED.

A micro-light emitting diode display panel (hereinafter, micro-LED panel) is one of the flat display panels and is composed of a plurality of inorganic light emitting diodes (inorganic LEDs) that is 100 micrometers or less.

The micro-LED panel is also a self-light emitting device, but the micro-LED does not suffer from the screen burn-in and has excellent luminance, resolution, power consumption, and durability because of its inorganic nature.

In comparison with the LCD panel requiring a backlight, a micro-LED panel may offer better contrast, response times, and energy efficiency. Both organic light emitting diodes (OLEDs) and micro-LEDs corresponding to inorganic light emitting diodes have good energy efficiency. However, the micro-LED has higher brightness and emission efficiency, and longer lifetime than the OLED.

In addition, by arraying the LEDs on a circuit board in pixel units, it is possible to manufacture a display module in a substrate unit, and it is easy to manufacture a display device in various resolutions and screen sizes according to the customer's order.

SUMMARY

Additional aspects will be set forth in part in the description which follows and, in part, will be apparent from the description, or may be learned by practice of the presented embodiments.

The disclosure relates to a display device, and more specifically, provides a display device capable of preventing a screen displayed by a plurality of display modules from having a lowered display performance in some areas due to high temperature heat generated from inorganic light emitting diodes.

According to an aspect of the disclosure, a display device includes: a display panel including a plurality of display modules arranged in parallel with each other in a M*N matrix form, wherein each of the plurality of display modules includes a substrate including a mounting surface on which a plurality of inorganic light emitting diodes are mounted and a rear surface arranged on a side opposite of the mounting surface, and a module heat dissipation member provided to be in contact with the rear surface of the substrate, and the display panel includes a panel heat dissipation member connecting the module heat dissipation members of the plurality of display modules to dissipate heat between the module heat dissipation members of the plurality of display modules.

The module heat dissipation member may be a metal material.

The module heat dissipation member may be a vapor chamber.

The panel heat dissipation member may be a metal material.

The panel heat dissipation member may be formed of a nickel alloy.

A thermal expansion coefficient of the panel heat dissipation member may be provided at a value substantially corresponding to a thermal expansion coefficient of the substrate.

The panel heat dissipation member may support the plurality of display modules such that the plurality of display modules are arranged in parallel with each other in a M*N matrix form.

The module heat dissipation member may be provided such that high temperature heat generated at one point of the substrate may be transferred to an entire area of the substrate in a direction parallel to the substrate for the substrate to be maintained in thermal equilibrium in the direction parallel to the substrate.

The module heat dissipation member may include four edges corresponding to four edges of the substrate, respectively, and the substrate may have an area at least larger than or equal to an area of the module heat dissipation member.

The plurality of display modules may include a first display module including a first substrate and a second display module disposed in parallel with the first display module and including a second substrate, the module heat dissipation member may include a first module heat dissipation member corresponding to the first display module and a second module heat dissipation member corresponding to the second display module, and the panel heat dissipation member may be provided to be in contact with a rear surface of the first module heat dissipation member and a rear surface of the second module heat dissipation member.

The panel heat dissipation member may be configured to, when an amount of heat remaining in the first module heat dissipation member due to the first substrate is greater than an amount of heat remaining in the second module heat dissipation member due to the second substrate, transfer heat from the first module heat dissipation member to the second module heat dissipation member such that each of the first module heat dissipation member and the second module heat dissipation member is reaches set into a thermal equilibrium state.

The panel heat dissipation member may be provided to cover all of the four edges of the module heat dissipation member of each of the plurality of display modules in a direction toward the rear surface.

The display device may further include a frame provided to support the plurality of display modules such that the plurality of display modules may be arranged in parallel with each other in an M*N matrix form, and the panel heat dissipation member may be provided to be in contact with the frame in a front and rear side direction.

A thermal expansion coefficient of the panel heat dissipation member may be provided at a value substantially corresponding to a thermal expansion coefficient of the substrate.

According to an aspect of the disclosure, a display device includes: a display panel including a plurality of display modules arranged in parallel with each other in a M*N matrix form, wherein each of the plurality of display modules includes a substrate including a mounting surface on which a plurality of inorganic light emitting diodes are mounted and a rear surface arranged on a side opposite of the mounting surface, and a module heat dissipation member provided to be in contact with the rear surface of the substrate, wherein the module heat dissipation member is provided as a vapor chamber that is provided to allow high temperature heat generated from one point on the substrate to be transferred to an entire area of the substrate in a direction parallel with the substrate such that the substrate maintains thermal equilibrium in the direction parallel with the substrate.

In addition, the display panel may include a panel heat dissipation member connecting the module heat dissipation members of the plurality of display modules to dissipate heat between the module heat dissipation members of the plurality of display modules.

In addition, the panel heat dissipation member may be provided as a metal material.

In addition, a thermal expansion coefficient of the panel heat dissipation member may be provided at a value substantially corresponding to a thermal expansion coefficient of the substrate.

In addition, the display device may further include a frame provided to support the plurality of display modules such that the plurality of display modules may be arranged in parallel with each other in an M*N matrix form, and the panel heat dissipation member may be provided to be in contact with the frame in a front and rear side direction According to an aspect of the disclosure, a display device includes: a display panel including a plurality of display modules; and a frame provided to support the plurality of display modules such that the plurality of display modules may be arranged in parallel with each other in an M*N matrix form, wherein each of the plurality of display modules includes a substrate including a mounting surface on which a plurality of inorganic light emitting diodes are mounted and a rear surface arranged on a side opposite of the mounting surface, and a module heat dissipation member provided to be in contact with the rear surface of the substrate to dissipate heat generated from the substrate, wherein the display panel includes a panel heat dissipation member provided in a shape corresponding to a shape of the frame in a front and rear side direction and connecting the module heat dissipation members of the plurality of display modules to dissipate heat between the module heat dissipation members of the plurality of display modules.

The display device according to an embodiment of the disclosure is implemented to, when high temperature heat is generated in some areas of a plurality of display modules, make the temperature inside the display module uniform using a module heat dissipation member so that the image quality can be kept uniform in the display module, and also make the temperatures of the plurality of display modules uniform using a panel heat dissipation member so that the image quality can be kept uniform in a display panel.

BRIEF DESCRIPTION OF DRAWINGS

The above and other aspects and features of certain embodiments of the present disclosure will be more apparent from the following description taken in conjunction with the accompanying drawings, in which.

DETAILED DESCRIPTION

Figure 1:
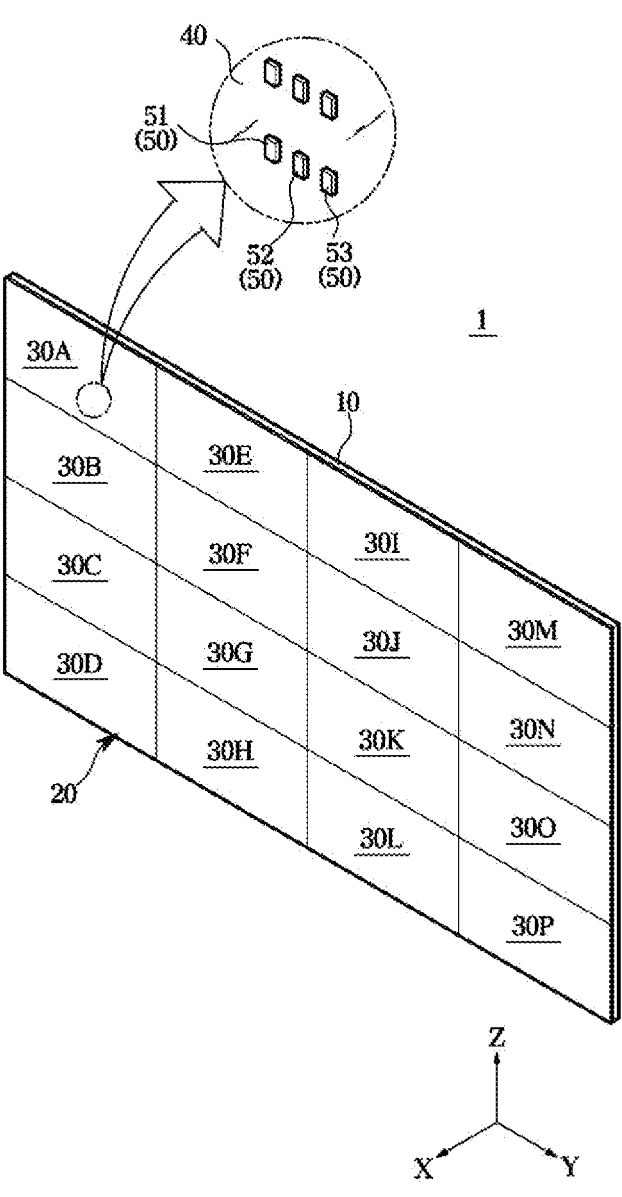
FIG. 1 is a view illustrating a display device according to an embodiment of the disclosure.

Embodiments described in the disclosure and configurations shown in the drawings are merely examples of the embodiments of the disclosure, and the scope of the disclosure should be understood to include various modifications or equivalents to replace the embodiments at the time of filing of the present application.

The singular forms "a," "an" and "the" are intended to include the plural forms as well, unless the context clearly indicates otherwise. The shapes and sizes of elements in the drawings may be exaggerated for the clear description.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

Also, in the present description, the meaning of "identical" includes things that are similar to each other in properties or are similar within a certain range. Also, "identical" means "substantially identical". It should be understood that "substantially identical" means that a value corresponding to differences within a negligible range with respect to a reference value or a numerical value corresponding to a manufacturing error range are included in the range of "identical".

Hereinafter embodiments according to the disclosure will be described in detail with reference to the accompanying drawings.

Figure 2:
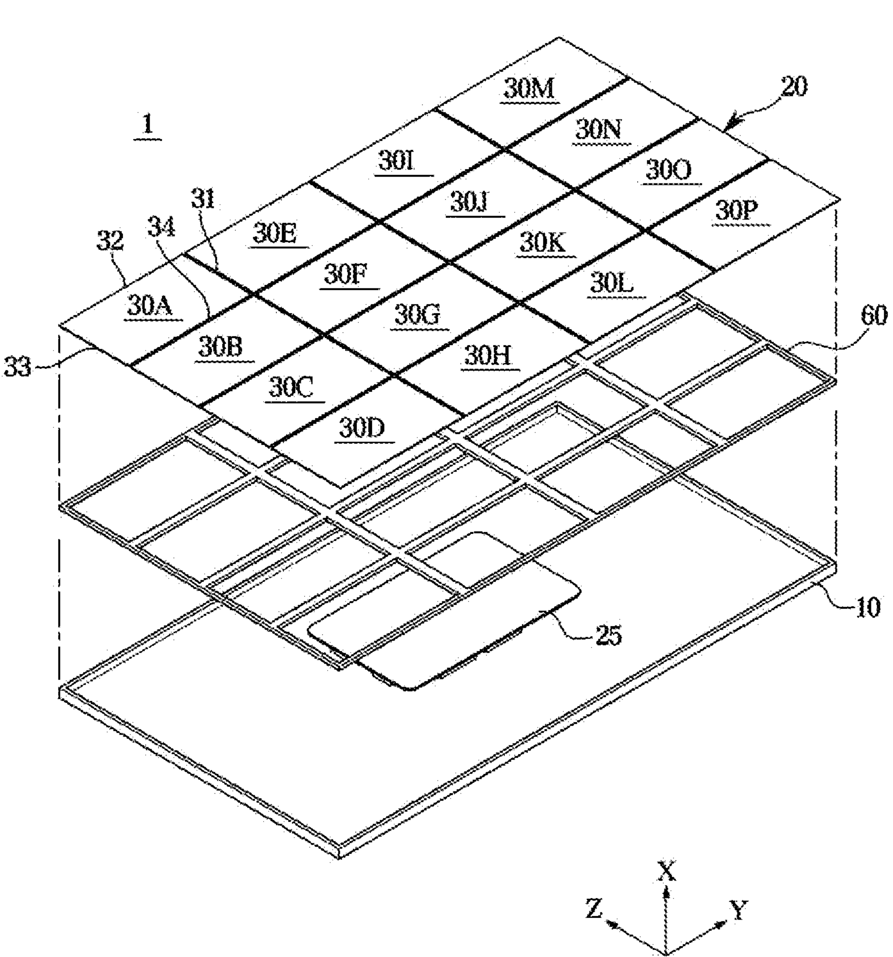
FIG. 2 is an exploded view illustrating a main configuration of the display device shown in FIG. 1.
Figure 3:
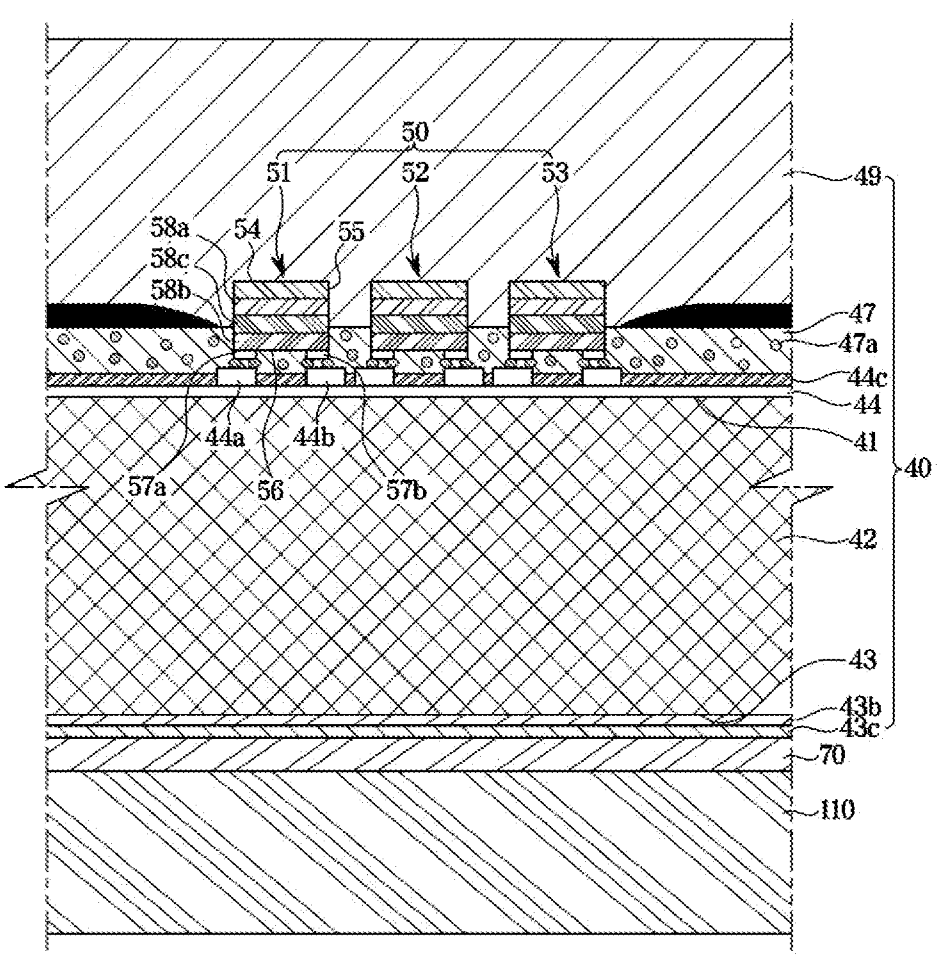
FIG. 3 is an enlarged cross-sectional view illustrating a configuration of a part of one display module shown in FIG. 1.
Figure 4:
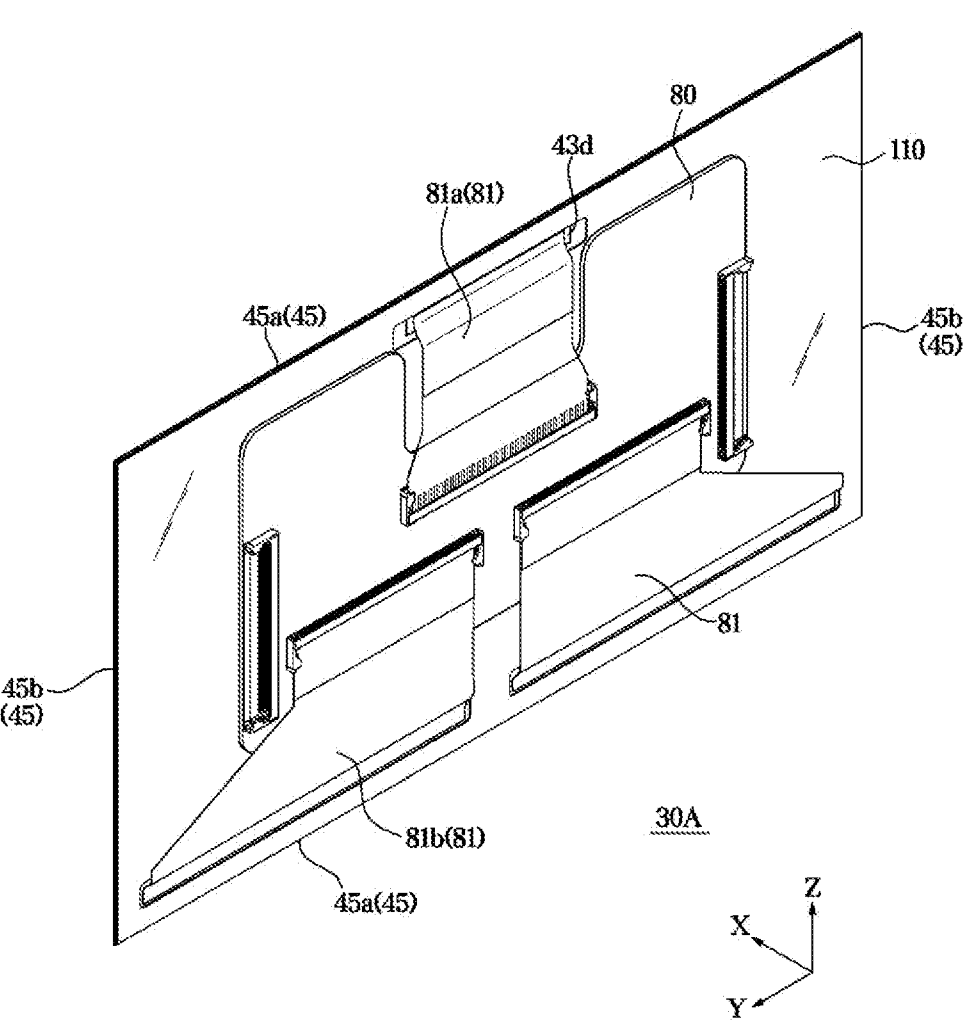
FIG. 4 is a rear perspective view illustrating one display module of the display device shown in FIG. 1.

FIG. 1 is a view illustrating a display device according to an embodiment of the disclosure, FIG. 2 is an exploded view illustrating a main configuration of the display device shown in FIG. 1, FIG. 3 is an enlarged cross-sectional view illustrating a configuration of a part of one display module shown in FIG. 1, and FIG. 4 is a rear perspective view illustrating one display module of the display device shown in FIG. 1.

A part of a configuration of a display device 1 as well as a plurality of inorganic light emitting diodes 50 illustrated in the drawings is a component in a micro-unit having a size of several μm to hundreds of μm, and for convenience of description, some components (the plurality of inorganic light emitting diodes 50 and a black matrix 58, etc.) are exaggerated.

The display device 1 is a device that displays information, material, data, etc. as characters, figures, graphs, images, etc, and a television, a personal computer, mobile, and a digital signage may be implemented as the display device 1.

According to an embodiment of the disclosure, as illustrated in FIGS. 1 and 2, the display device 1 may include a display panel 20 provided to display an image, a power supply device (not shown) configured to supply power to the display panel 20, a main board 25 configured to control an overall operation of the display panel 20, a frame 60 provided to support the display panel 20, and a rear cover 10 provided to cover a rear surface of the frame 60.

The display panel 20 may include a plurality of display modules 30A-30P, a driver board (not shown) configured to drive each of the display modules 30A-30P, and a timing controller (T-con) board configured to generate a timing signal to control the each of the display modules 30A-30P.

The rear cover 10 may support the display panel 20. The rear cover 10 may be installed on the floor through a stand (not shown), or may be installed on a wall through a hanger (not shown).

The plurality of display modules 30A-30P may be arranged vertically and horizontally to be adjacent to each other. The plurality of display modules 30A-30P may be arranged in an M*N matrix. In the embodiment, 16 display modules 30A-30P are provided and arranged in a matrix of 4*4, but there is no limitation in the number and arrangement method of the plurality of display modules 30A-30P.

The plurality of display modules 30A-30P may be installed in the frame 60. The plurality of display modules 30A-30P may be installed in the frame 60 through various known methods such as magnetic force using a magnet or a mechanical fitting structure or bonding. The rear cover 10 may be coupled to the rear of the frame 60, and the rear cover 10 may form a rear exterior of the display device 1.

The rear cover 10 may include a metal material. Accordingly, heat generated from the plurality of display modules 30A-30P and the frame 60 may be easily conducted to the rear cover 10 to increase the heat dissipation efficiency of the display device 1.

As described above, the display device 1 according to the embodiment of the disclosure may implement a large screen by tiling the plurality of display modules 30A-30P.

Unlike the embodiment of the disclosure, a single display module in the plurality of display modules 30A-30P may be applied to a display device. That is, as a single unit, the display modules 30A-30P may be installed and applied in a wearable device, a portable device, a handheld device and an electronic product or an electrical component that requires a display. As described in the embodiment of the disclosure, the plurality of display modules 30A-30P may be assembled in a matrix type and then applied to a display device such as a monitor for a personal computer (PC), a high-resolution TV and a signage, and an electronic display.

The plurality of display modules 30A-30P may include the same configuration. Accordingly, a description of any one display module described below may be equally applied to all other display modules.

Among the plurality of display modules 30A-30P, the first display module 30A may be formed in a quadrangle type. Alternatively, the first display module 30A may be provided in a rectangular type or a square type.

Accordingly, the first display module 30A may include edges 31, 32, 33, and 34 formed in up, down, left and right direction with respect to the first direction X, which is the front.

As illustrated in FIG. 3, each of the plurality of display modules 30A-30P may include the substrate 40 and a plurality of inorganic light emitting diodes 50 mounted on the substrate 40. The plurality of inorganic light emitting diodes 50 may be mounted on a mounting surface 41 of the substrate 40 facing the first direction X. In FIG. 3, for convenience of description, a thickness of the substrate 40 in the first direction X is shown to be enlarged.

The substrate 40 may be formed in a quadrangle type. As described above, the each of the plurality of display modules 30A-30P may be provided in a quadrangle type, and thus the substrate 40 may be formed in a quadrangle type to correspond to the type of the display module.

Alternatively, the substrate 40 may be provided in a rectangle type or a square type.

Therefore, as for the first display module 30A, the substrate 40 may include four edges corresponding to the edges 31, 32, 33, and 34 of the first display module 30A formed in four directions of up, down, left and right with respect to the first direction X that is the front.

The substrate 40 may include a base substrate 42, the mounting surface 41 forming one surface of the base substrate 42, a rear surface 43 forming an other surface of the base substrate 42 and arranged on a side opposite of the mounting surface 41, and a side surface 45 arranged between the mounting surface 41 and the rear surface 43 (see FIG. 4).

The substrate 40 may include a thin film transistor (TFT) layer 43 formed on the base substrate 42 to drive the inorganic light emitting diodes 50. The base substrate 42 may include a glass substrate. That is, the substrate 40 may include a Chip on Glass (COG) type substrate. The first pad electrode **44*a* and the second pad electrode 44*b* provided to electrically connect the inorganic light emitting diodes 50 to the TFT layer 43 may be formed on the substrate 40**.

A thin film transistor (TFT) forming the TFT layer 43 is not limited to a specific structure or type, and may be configured in various embodiments. That is, the TFT of the TFT layer 43 according to an embodiment of the disclosure may be implemented as an organic TFT and a graphene TFT as well as a Low Temperature Poly Silicon (LTPS) TFT, an oxide TFT, and a Si TFT such as a poly silicon, or a-silicon TFT.

Alternatively, based on the base substrate 42 of the substrate 40 being formed of a silicon wafer, the TFT layer 43 may be replaced with a Complementary Metal-Oxide Semiconductor (CMOS) transistor, an n-type metal-oxide semiconductor field-effect-transistor (MOSFET) or a p-type MOSFET.

The plurality of inorganic light emitting diodes 50 may be formed of an inorganic material, and may include inorganic light emitting diodes having sizes of several μm to several tens of μm in width, length, and height, respectively. The micro-inorganic light emitting device may have a length of 100 μm or less on a short side among width, length, and height. That is, the inorganic light emitting device 50 may be picked up from a sapphire or silicon material and directly transferred onto the substrate 40. The plurality of inorganic light emitting diodes 50 may be picked up and transported through an electrostatic method using an electrostatic head or a stamp method using an elastic polymer material such as Polydimethylsiloxane (PDMS) or silicon as a head.

The plurality of inorganic light emitting diodes 50 may be a light emitting structure including an n-type semiconductor 58*a*, an active layer 58*c*, a p-type semiconductor 58*b*, a first contact electrode 57*a*, and a second contact electrode 57*b*.

Although not shown in the drawing, one of the first contact electrode 57*a* and the second contact electrode 57*b* may be electrically connected to the n-type semiconductor 58*a* and the other of the first contact electrode 57*a* and the second contact electrode 57*b* may be electrically connected to the p-type semiconductor 58*b*.

The first contact electrode 57*a* and the second contact electrode 57*b* may be a flip chip type in which the first contact electrode 57*a* and the second contact electrode 57*b* are horizontally arranged to face the same direction (a direction opposite to an emission direction).

The inorganic light emitting diodes 50 may include a light emitting surface 54 arranged to face the first direction X, a side surface 55, and a bottom surface 56 arranged to be opposite to the light emitting surface 54, which are based on arrangement in which the inorganic light emitting diodes 50 are mounted on the mounting surface 41. The first contact electrode 57*a* and the second contact electrode 57*b* may be formed on the bottom surface 56.

That is, the contact electrodes 57*a* and 57*b* of the inorganic light emitting diodes 50 may be arranged on the opposite side of the light emitting surface 54, and accordingly, the contact electrodes 57*a* and 57*b* may be arranged on the opposite side to the direction in which light is emitted.

The contact electrodes 57*a* and 57*b* may be arranged to face the mounting surface 41, and provided to be electrically connected to the TFT layer 44. The light emitting surface 54 emitting light may be arranged in a direction opposite to the direction in which the contact electrodes 57*a* and 57*b* are arranged.

Therefore, in response to light that is generated from the active layer 58*c* and emitted in the first direction X through the light emitting surface 54, the light may be emitted toward the first direction X without the interference of the first contact electrode 57*a* or the second contact electrode 57*b*.

That is, the first direction X may be defined as a direction in which the light emitting surface 54 is arranged to emit light.

The first contact electrode 57*a* and the second contact electrode 57*b* may be electrically connected to a first pad electrode 44*a* and a second pad electrode 44*b*, respectively, formed on the mounting surface 41 side of the substrate 40.

The inorganic light emitting device 50 may be directly connected to the pad electrodes 44*a* and 44*b* through an anisotropic conductive layer 47 or a bonding structure such as solder.

The anisotropic conductive layer 47 may be formed on the substrate 40 to mediate electrical bonding between the contact electrodes 57*a* and 57*b* and the pad electrodes 44*a* and 44*b*. The anisotropic conductive layer 47 may include a structure in which an anisotropic conductive adhesive is attached on a protective film, and particularly, a structure in which conductive balls 47*a* are dispersed in an adhesive resin. The conductive ball 47*a* may be a conductive sphere surrounded by a thin insulating film, and may electrically connect conductors to each other as the insulating film is broken by pressure.

The anisotropic conductive layer 47 may include an anisotropic conductive film (ACF) in the form of a film and an anisotropic conductive paste (ACP) in the form of a paste.

Therefore, by a pressure applied to the anisotropic conductive layer 47 in a state in which the plurality of inorganic light emitting diodes 50 is mounted on the substrate 40, the insulating film of the conductive balls 47*a* may be broken and thus the contact electrodes 57*a* and 57*b* of the inorganic light emitting device 50 may be electrically connected to the pad electrodes 44*a* and 44*b* of the substrate 40.

However, although not shown in the drawings, the plurality of inorganic light emitting diodes 50 may be mounted on the substrate 40 through solder (not shown) instead of the anisotropic conductive layer 47. After the inorganic light emitting device 50 is aligned on the substrate 40, the inorganic light emitting device 50 may be bonded to the substrate 40 through a reflow process.

The plurality of inorganic light emitting diodes 50 may include a red light emitting device 51, a green light emitting device 52, and a blue light emitting device 53. As for the inorganic light emitting device 50, a series of the red light emitting device 51, the green light emitting device 52, and the blue light emitting device 53 may be mounted on the mounting surface 41 of the substrate 40 as one unit. A series of the red light emitting device 51, the green light emitting device 52, and the blue light emitting device 53 may form a single pixel. In this case, the red light emitting device 51, the green light emitting device 52, and the blue light emitting device 53 may each form a respective sub pixel.

The red light emitting device 51, the green light emitting device 52, and the blue light emitting device 53 may be arranged in a line at a predetermined interval according to the embodiment of the disclosure, and alternatively, arranged in other shapes such as a triangular shape.

The substrate 40 may include a light absorbing layer 44*c* to absorb external light to improve contrast. The light absorbing layer 44*c* may be formed on the entire mounting surface 41 of the substrate 40. The light absorbing layer 44*c* may be formed between the TFT layer 44 and the anisotropic conductive layer 47.

The plurality of display modules 30A-30P may further include a black matrix 58 formed between the plurality of inorganic light emitting diodes 50.

The black matrix 48 may perform a function of supplementing the light absorbing layer 44*c* formed entirely on the mounting surface 41 side of the substrate 40. That is, the black matrix 48 may absorb external light to allow the substrate 40 to appear black, thereby improving the contrast of the screen.

It is appropriate that the black matrix 48 has a black color.

According to the embodiment, the black matrix 48 may be arranged between pixels formed by a series of the red light emitting device 51, the green light emitting device 52, and the blue light emitting device 53. Unlike the embodiment, the black matrix 48 may be formed more precisely to partition each of the light emitting devices 51, 52, and 53 corresponding to the sub-pixels.

The black matrix 48 may be formed in a grid shape having a horizontal pattern and a vertical pattern to be arranged between pixels.

The black matrix 48 may be formed by applying a light-absorbing ink on the anisotropic conductive layer 46 and then curing the light-absorbing ink through an ink-jet process, or by coating a light-absorbing film on the anisotropic conductive layer 47.

That is, on the anisotropic conductive layer 47 formed entirely on the mounting surface 41, the black matrix 48 may be arranged on a space, in which the plurality of inorganic light emitting diodes 50 is not mounted, between the plurality of inorganic light emitting diodes 50.

The plurality of display modules 30A-30P may include a front cover 49 arranged in the first direction X on the mounting surface 41 to cover the mounting surface 41 of the plurality of display modules 30A-30P.

The front cover 49 may be provided in plural so as to be respectively formed in the first direction X on the plurality of display modules 30A-30P.

The front cover 49 may include an adhesive layer (not shown) provided to bond the front cover 70 to the mounting surface 41 of the substrate 40.

The front cover 49 may have a film (not shown) that is provided as a functional film having optical performance.

The front cover 49 may be provided to cover the substrate 40 to protect the substrate 40 from external forces.

Typically, the adhesive layer of the front cover 49 may be provided to have a height greater than or equal to a predetermined height in the first direction X in which the mounting surface 41 or the light emitting surface 54 faces.

This is to sufficiently fill a gap that may be formed between the front cover 49 and the plurality of inorganic light emitting diodes 50 when the front cover 49 is disposed on the substrate 40.

Each of the plurality of display modules 30A-30P may include a module heat dissipation member 110 provided on the rear surface 43 of a corresponding one of the substrates 40 to dissipate heat generated from the substrate 40.

Heat generated from the substrate 40 may include heat generated from various components. Among the heat generated from the substrate 40 and transferred to the rear surface 43, heat generated when the plurality of inorganic light emitting diodes 50 emit light accounts for the greatest portion of the heat. However, in addition to this, heat may be generated from a plurality of components disposed on the mounting surface 41 of the substrate 40, such as the TFT layer 44, and the heat generated from the plurality of components may flow into the substrate 40.

In addition, heat may be transferred from the outside of the substrate 40 to the substrate 40, and heat may be transferred to the substrate 40 through other components than the substrate 40, which may causing heat to be generated from the substrate 40.

In the following description, heat generated from the substrate 40 refers to heat substantially generated from a plurality of components, disposed on the substrate 40, including a plurality of inorganic light emitting diodes 50 and introduced into the substrate 40.

In particular, as described above, since the heat generated from the plurality of inorganic light emitting diodes 50 flows into the substrate 40 the most, the heat generated from the plurality of inorganic light emitting diodes 50 accounts for the greatest proportion of the heat generated from the substrate 40. However, as described above, it is also possible to express that the substrate 40 is subject to heat generation by heat generated from various components other than the plurality of inorganic light emitting diodes 50 and from outside of the substrate 40. In addition, each of the plurality of display modules 30A-30P may include an adhesive tape 70 arranged between the rear surface 43 and the module heat dissipation member 110 to bond the module heat dissipation member 110 to the rear surface 43 of the substrate 40.

The plurality of inorganic light emitting diodes 50 may be electrically connected to a pixel driving wiring (not shown) formed on the mounting surface 41, and an upper wiring layer (not shown) extending through the side surface 45 of the substrate 40 and formed as a pixel driving wiring (not shown).

The upper wiring layer (not shown) may be formed under the anisotropic conductive layer 47. The upper wiring layer (not shown) may be electrically connected to a side wiring (not shown) formed on the side surface 45 of the substrate 40. The side wiring (not shown) may be provided in the form of a thin film.

The upper wiring layer (not shown) may be connected to the side wiring (not shown) by an upper connection pad (not shown) formed on the edge side of the substrate 41.

The side wiring (not shown) may extend along the side surface 45 of the substrate 40 and may be connected to a rear wiring layer 43*b* formed on the rear surface 43.

An insulating layer 43*c* covering the rear wiring layer 43*b* may be formed on the rear wiring layer 43*b* in a direction to which the rear surface of the substrate 40 faces.

That is, the plurality of inorganic light emitting diodes 50 may be sequentially and electrically connected to the upper wiring layer (not shown), the side wiring (not shown), and the rear wiring layer 43*b*.

Further, as illustrated in FIG. 4, the display module 30A may include a driver circuit board 80 provided to electrically control the plurality of inorganic light emitting diodes 50 mounted on the mounting surface 41. The driver circuit board 80 may be formed of a printed circuit board. The driver circuit board 80 may be arranged on the rear surface 43 of the substrate 40 in the first direction X. As will be described below in detail, the driver circuit board 80 may be arranged on the module heat dissipation member 110 bonded to the rear surface 43 of the substrate 40.

The display module 30A may include a flexible film 81 connecting the driver circuit board 80 to the rear wiring layer 43*b* to allow the driver circuit board 80 to be electrically connected to the plurality of inorganic light emitting diodes 50.

Particularly, one end of the flexible film 81 may be connected to a rear connection pad 43*d* arranged on the rear surface 43 of the substrate 40 and electrically connected to the plurality of inorganic light emitting diodes 50.

The rear connection pad 43*d* may be electrically connected to the rear wiring layer 43*b*. Accordingly, the rear connection pad 43*d* may electrically connect the rear wiring layer 43*b* to the flexible film 81.

Because the flexible film 81 is electrically connected to the rear connection pad 43*d*, the flexible film 81 may transmit power and an electrical signal from the driver circuit board 80 to the plurality of inorganic light emitting diodes 50.

The flexible film 81 may be formed of a flexible flat cable (FFC) or a chip on film (COF).

The flexible film 81 may include a first flexible film 81*a* and a second flexible film 81*b* that are respectively arranged in the up and down direction with respect to the first direction X.

The first and second flexible films 81*a* and 81*b* are not limited thereto, and may be arranged in the left and right directions with respect to the first direction X, or may be arranged in at least two directions in the up, down, left, and right directions, respectively.

The second flexible film 81*b* may be provided in plural. However, the disclosure is not limited thereto, and a single second flexible film 81*b* may be provided, and the first flexible film 81*a* may also be provided in plural.

The first flexible film 81*a* may transmit a data signal from the driver circuit board 80 to the substrate 40. The first flexible film 81*a* may be formed of COF.

The second flexible film 81*b* may transmit power from the driver circuit board 80 to the substrate 40. The second flexible film 81*b* may be formed of FFC.

However, the disclosure is not limited thereto, and the first flexible film 81*a* may transmit power from the driver circuit board 80 to the substrate 40 and be formed of FFC, and the second flexible film 81*b* may transmit a data signal from the driver circuit board 80 to the substrate 40 and be formed of COF.

Although not shown in the drawings, the driver circuit board 80 may be electrically connected to a main board 25 (refer to FIG. 2). The main board 25 may be arranged on the rear side of the frame 60. At the rear of the frame 60, the main board 25 may be connected to the driver circuit board 80 through a cable (not shown).

As described above, the module heat dissipation member 110 may be provided to be in contact with the substrate 40. The module heat dissipation member 110 and the substrate 40 may be bonded to each other by the adhesive tape 70 arranged between the rear surface 43 of the substrate 40 and the module heat dissipation member 110.

The module heat dissipation member 110 may be formed of a material having high thermal conductivity or may be implemented using a component having high thermal conductivity. Details thereof will be described below.

Heat generated by the plurality of inorganic light emitting diodes 50 mounted to the substrate 40 and the TFT layer 43 may be transferred to the module heat dissipation member 110 through the adhesive tape 70 along the rear surface 43 of the substrate 40.

Accordingly, heat generated by the substrate 40 may be easily transferred to the module heat dissipation member 110 and it is possible to prevent a temperature of the substrate 40 from being greater than or equal to a predetermined temperature.

The plurality of display modules 30A-30P may be arranged in various positions in the form of an M*N matrix. Each of the display modules 30A-30P is provided to be individually movable. In this case, each of the display modules 30A-30P may include the module heat dissipation member 110 to maintain a certain level of heat dissipation performance regardless of a position in which each of the display modules 30A-30P is arranged.

The plurality of display modules 30A-30P may be provided in the form of various M*N matrixes so as to form various-sized screens of the display device 1. Accordingly, in comparison with the heat dissipation through a single heat dissipation member provided for the heat dissipation, each of the display modules 30A-30P according to an embodiment of the disclosure may include an independent module heat dissipation member 110 so as to individually dissipate the heat, thereby improving the heat dissipation performance of the entire display device 1.

Based on a single heat dissipation member arranged inside the display device 1, a part of the heat dissipation member may not be arranged at a position corresponding to a position where some display modules are arranged in the front and rear direction, and the heat dissipation member may be arranged at a position corresponding to a position where any display module is not arranged in the front and rear direction. Therefore, the heat dissipation efficiency of the display device 1 may be reduced.

That is, regardless of the position of the display modules 30A-30P, the display modules 30A-30P may perform self-heat dissipation by the their respective module heat dissipation members 110, arranged on the display modules 30A-30P, and thus it is possible to improve the heat dissipation performance of the entire display device 1.

The module heat dissipation member 110 may be provided in a quadrangular shape substantially corresponding to the shape of the substrate 40.

An area of the substrate 40 may be at least equal to or greater than an area of the module heat dissipation member 110. In response to the substrate 40 and the module heat dissipation member 110 being arranged side by side in the first direction X, the four edges of the substrate 40 having a rectangular shape may be formed to correspond to the four edges of the module heat dissipation member 110 with respect to the center of the substrate 40 and the module heat dissipation member 110, or the four edges of the substrate 40 having a rectangular shape may be formed to be arranged outwards of the four edges of the module heat dissipation member 110 with respect to the center of the substrate 40 and the module heat dissipation member 110.

It is appropriate that the four edges of the substrate 40 are provided to be arranged outside the four edges of the module heat dissipation member 110. That is, the area of the substrate 40 may be provided to be greater than the area of the module heat dissipation member 110.

When heat is transferred to each of the display modules 30A-30P, the substrate 40 and the module heat dissipation member 110 may be thermally expanded, the module heat dissipation member 110 formed of a material having high thermal conductivity or implemented using a component having high thermal conductivity may have a higher coefficient of thermal expansion than the substrate 40 and thus a value at which the module heat dissipation member 110 expands is greater than a value at which the substrate 40 expands.

In this case, when the four edges of the substrate 40 are arranged to correspond to the four edges of the module heat dissipation member 110 or arranged inwards of the four edges of the module heat dissipation member 110, the edges of the module heat dissipation member 110 may protrude to the outside of the substrate 40.

Accordingly, a separation distance between gaps formed between the respective display modules 30A-30P may be irregularly formed by the thermal expansion of the module heat dissipation member 110 of each of the modules 30A-30P. Therefore, some of seams may be easily recognized and thus the integrity of the screen of the display panel 20 may be reduced.

However, since the four edges of the substrate 40 are arranged outside the four edges of the module heat dissipation member 110, even when the substrate 40 and the module heat dissipation member 110 are thermally expanded, the module heat dissipation member 110 may not protrude to the outside of the four edges of the substrate 40. Accordingly, the separation distance of the gap formed between the display modules 30A-30P may be constantly maintained.

According to an embodiment of the disclosure, the area of the substrate 40 may be provided to substantially correspond to the area of the module heat dissipation member 110. Accordingly, heat generated from the substrate 40 may be evenly dissipated in the entire region of the substrate 40 without being isolated to a partial region.

The module heat dissipation member 110 may be bonded to the rear surface 43 of the substrate 40 by the adhesive tape 70.

The adhesive tape 70 may have a size corresponding to a size of the module heat dissipation member 110. That is, the area of the adhesive tape 70 may be provided to correspond to the area of the module heat dissipation member 110. The module heat dissipation member 110 may be provided in a substantially quadrangular shape, and the adhesive tape 70 may be provided in a quadrangular shape to correspond to the shape of the module heat dissipation member 110.

The edge of the module heat dissipation member 110 and the edge of the adhesive tape 70 in the rectangular shape may be formed to correspond to each other with respect to the center of the module heat dissipation member 110 and the adhesive tape 70.

Accordingly, the module heat dissipation member 110 and the adhesive tape 70 may be easily manufactured in a single coupling configuration, and thus it is possible to increase the manufacturing efficiency of the entire display device 1.

That is, in response to the module heat dissipation member 110 being cut from one plate into a unit number, the adhesive tape 70 may be pre-bonded to one plate before the module heat dissipation member 110 is cut, and thus the adhesive tape 70 and the module heat dissipation member 110 may be simultaneously cut into a unit number, thereby reducing the process.

Heat generated by the substrate 40 may be transferred to the module heat dissipation member 110 through the adhesive tape 70. Accordingly, the adhesive tape 70 may be provided to bond the module heat dissipation member 110 to the substrate 40 while transferring the heat generated by the substrate 40 to the module heat dissipation member 110.

Accordingly, the adhesive tape 70 may include a material having high temperature heat dissipation performance.

Basically, the adhesive tape 70 may include a material having an adhesive property to bond the substrate 40 and the module heat dissipation member 110.

Additionally, the adhesive tape 70 may include a material having higher heat dissipation performance than a material having general adhesive properties. Accordingly, heat may be efficiently transferred from between the substrate 40 and the module heat dissipation member 110 to each component.

In addition, the material having the adhesive property of the adhesive tape 70 may be formed of a material having higher heat dissipation performance than the adhesive material forming the general adhesive.

A material having higher heat dissipation performance means a material that effectively transfers heat with high thermal conductivity, high temperature heat transfer, and low specific heat.

For example, the adhesive tape 70 may include a graphite material. However, the disclosure is not limited thereto, and the adhesive tape 70 may be generally formed of a material having high temperature heat dissipation performance.

Flexibility of the adhesive tape 70 may be greater than flexibility of the substrate 40 and flexibility of the module heat dissipation member 110. Accordingly, the adhesive tape 70 may be formed of a material having high flexibility as well as an adhesive property and heat dissipation property. The adhesive tape 70 may be formed of an inorganic double-sided tape. As described above, the adhesive tape 70 is formed of an inorganic tape, and thus the adhesive tape 70 may be provided as a single layer in which a base material, which supports one surface bonded to the substrate 40 and the other surface bonded to the module heat dissipation member 110, is not provided between the one surface and the other surface.

Because the adhesive tape 70 does not include a base material, the adhesive tape 70 may not include a material that interferes with heat conduction, thereby increasing the heat dissipation performance. However, the adhesive tape 70 is not limited to the inorganic double-sided tape, and may be provided as a heat-dissipating tape having better heat dissipation performance than a general double-sided tape.

Since the substrate 40 is formed of a glass material, and the module heat dissipation member 110 is formed of a material having higher thermal conductivity than the substrate 40, each of the substrate 40 and the module heat dissipation member 110 has a different material property and deforms to a different degree by the same heat. That is, when heat is generated from the substrate 40, the substrate 40 and the module heat dissipation member 110 may be thermally expanded to different sizes by the heat. Accordingly, the display module 30A may be damaged.

In a state in which the substrate 40 and the module heat dissipation member 110 are fixed to each other, the values at which the substrate 40 and the module heat dissipation member 110 are expanded at the same temperature are different from each other, and thus the substrate 40 and the module heat dissipation member 110 may be expanded to different sizes, which may generate stress in each of the substrate 40 and the module heat dissipation member 110.

Due to having a different material property, in particular, a different thermal expansion coefficient of each material leads to a different degree of physical deformation by heat. In particular, when the thermal expansion coefficient of the module heat dissipation member 110 is greater than the thermal expansion coefficient of the substrate 40, the same heat transferred to the substrate 40 and the module heat dissipation member 110 may cause the module heat dissipation member 110 to be expanded and deformed to a larger degree than that of the substrate 40.

Conversely, even when heat generation from the substrate 40 is terminated and the substrate 40 and the module heat dissipation member 110 are cooled, the module heat dissipation member 110 may shrink and deform to a larger degree than that of the substrate 40.

Since the substrate 40 and the module heat dissipation member 110 are in a state of being bonded to each other by the adhesive tape 70, an external force may be transmitted to the substrate 40 when the module heat dissipation member 110 is deformed to a larger degree than that of the substrate 40.

Conversely, the module heat dissipation member 110 may also be subject to an external force by the substrate 40, but when the rigidity of the substrate 40 formed of glass is smaller than that of the module heat dissipation member 110, the substrate 40 may be damaged.

The adhesive tape 70 may be provided to, when the substrate 40 and the module heat dissipation member 110 are expanding to different sizes, absorb external forces transferred to the substrate 40 and the module heat dissipation member 110 from the counterparts Accordingly, external forces may be prevented from being transferred to the substrate 40 and the module heat dissipation member 110, and in particular, the substrate 40 may be prevented from being damaged.

The adhesive tape 70 may be formed of a material with high flexibility so as to absorb the external force transferred from the substrate 40 and the module heat dissipation member 110. Particularly, the flexibility of the adhesive tape

70 may be greater than that of the substrate 40 and the module heat dissipation member 110.

Accordingly, in response to the external force, which is generated by the size change of the module heat dissipation member 110, being transmitted to the adhesive tape 70, the adhesive tape 70 itself may be deformed and thus the adhesive tape 70 may prevent the external force from being transmitted to different configurations.

The adhesive tape 70 may have a predetermined thickness in the first direction X. In response to the state of the adhesive tape 70 being expanded by the heat or being contracted, the module heat dissipation member 110 may be expanded or contracted in a direction perpendicular to the first direction X, as well as the first direction X and thus the external force may be transmitted to the substrate 40.

As described above, on the display panel 20, a screen may be displayed by the plurality of display modules 30A-30P. In this case, seams formed by gaps between the plurality of display modules 30A-30P may lower the sense of unity of the screen.

Accordingly, in order to minimize perception of the seams of the display panel 20, the plurality of display modules 30A-30P may be disposed on the frame 60 to form a constant gap. This is because, when the gaps formed by the plurality of display modules 30A-30P are not constant, the perception of seams may be amplified by some gaps.

In the case of a conventional display device, a frame supporting a display panel is formed of a metal material. A plurality of display modules may be tiled on the frame formed of metal.

With the display device being driven, heat generated from the display panel may allow substrates forming the plurality of display modules 30A-30P to be thermally expanded. The plurality of display modules 30A-30P, due to being supported by the frame formed of metal material as described above, may be caused to have gaps therebetween irregularly formed due to a thermal expansion of the substrate and a thermal expansion of the frame, and thus, perception of the seam may be amplified.

That is, the substrates of the plurality of display modules 30A-30P are each formed of a glass material so that each of the substrates may be thermally expanded at a constant value, but due to a thermal expansion of the metal frame supporting the substrates, some of the gaps between the plurality of display modules 30A-30P may be formed with regular widths. This is because a metal material has material properties different from material properties of a glass material.

Material properties of materials may have different values depending on the coefficient of thermal expansion, specific heat, and thermal conductivity. In particular, the substrate and the frame may be provided with different degrees of thermal expansion due to a difference between a thermal expansion coefficient of metal and a thermal expansion coefficient of glass.

Due to the thermal expansion of the frame bonded to the plurality of display modules 30A-30P in addition to the thermal expansion of the substrates of the plurality of display modules 30A-30P, separation distances of the gaps between the plurality of display modules 30A-30P may become irregular.

In order to prevent gaps between the plurality of display modules 30A-30P from becoming irregular due to the thermal expansion because the plurality of display modules 30A-30P are arranged on the frame formed of metal, the frame 60 according to the embodiment of the disclosure may be provided to allow the plurality of display modules 30A-30P to be bonded thereto and formed using a material having material properties similar to those of the substrates 40 of the plurality of display modules 30A-30P.

That is, the frame 60 may be provided to have material properties similar to those of the substrate 40 such that separation distances of gaps formed between the display modules 30A-30P are kept constant.

The meaning of being formed with material properties similar to material properties of the substrate 40 may include having a thermal expansion coefficient, a specific heat, and a thermal conductivity similar to those of the substrate 40. In particular, according to an embodiment of the disclosure, it may be interpreted that the thermal expansion coefficient of the substrate 40 corresponds to the thermal expansion coefficient of the frame 60.

The entire frame 60 may be formed of a material having material properties similar to those of the substrate 40 or may be provided with a material having a coefficient of thermal expansion similar to that of the substrate 40. It is appropriate that the frame 60 is formed of a material having the same value as the coefficient of thermal expansion of the substrate 40.

The frame 60 is not limited thereto, and the frame 60 may include a front layer (not shown) formed of a material having material properties corresponding to those of the substrate 40.

As the substrate 40 is bonded to the front layer (not shown) in the first direction X, the substrate 40 and the front layer (not shown) may be provided to expand by lengths corresponding to each other in response to the same heat being transferred to the substrate 40 and the front layer (not shown) in a second direction Y or a third direction Z orthogonal to the first direction X.

That is, regardless of whether the entire frame 60 is formed of a material having material properties corresponding to those of the substrate 40 or only the front layer (not shown) forming a front surface of the frame 60 is formed of a material having material properties corresponding to those of the substrate 40, a front surface of the frame 60, to which the substrates 40 of the display modules 30A-30P are bonded, may be thermally expanded at the same value as those of the substrates 30 when the substrates 40 of the display modules 30A-30P are thermally expanded by heat generated during driving of the display device 1.

Since the front surface of the frame 60, which is a base surface to which the plurality of display modules 30A-30P are bonded, is thermally expanded at the same value as those of the substrates 40 of the plurality of display modules 30A-30P, the distances of gaps formed between the plurality of display modules 30A-30P may be kept the same.

Accordingly, since the gaps formed between the plurality of display modules 30A-30P may maintain the same separation distance as in a state in which the substrates 40 are not thermally expanded, seams may be maintained in a constant level and the sense of unity of the screen may be maintained.

Therefore, even when heat generated by driving of the display device 1 is supplied to the substrates 40 of the plurality of display modules 30A-30P, the distances of the gaps between the plurality of display modules 30A-30P are maintained regular, thereby preventing some seams from being amplified and the sense of unity of the screen from being lowered.

The frame 60 is configured to support the display panel 20 and may be provided to have a rigidity greater than or equal to a predetermined magnitude. Accordingly, the body of the frame 60 may be formed of a metal material having a rigidity higher than or equal to a certain level, and the front surface of the frame 60 may be formed of a glass material corresponding to the substrate 40.

However, the frame 60 is not limited thereto and may be formed of a material having a thermal expansion coefficient different from that of the substrate 40. This is because a panel heat dissipation member 120 is additionally disposed between the frame 60 and the plurality of display modules 30A-30P. This will be described below in detail.

Hereinafter, the heat dissipation member 100 according to the embodiment of the disclosure will be described in detail.

Figure 5:
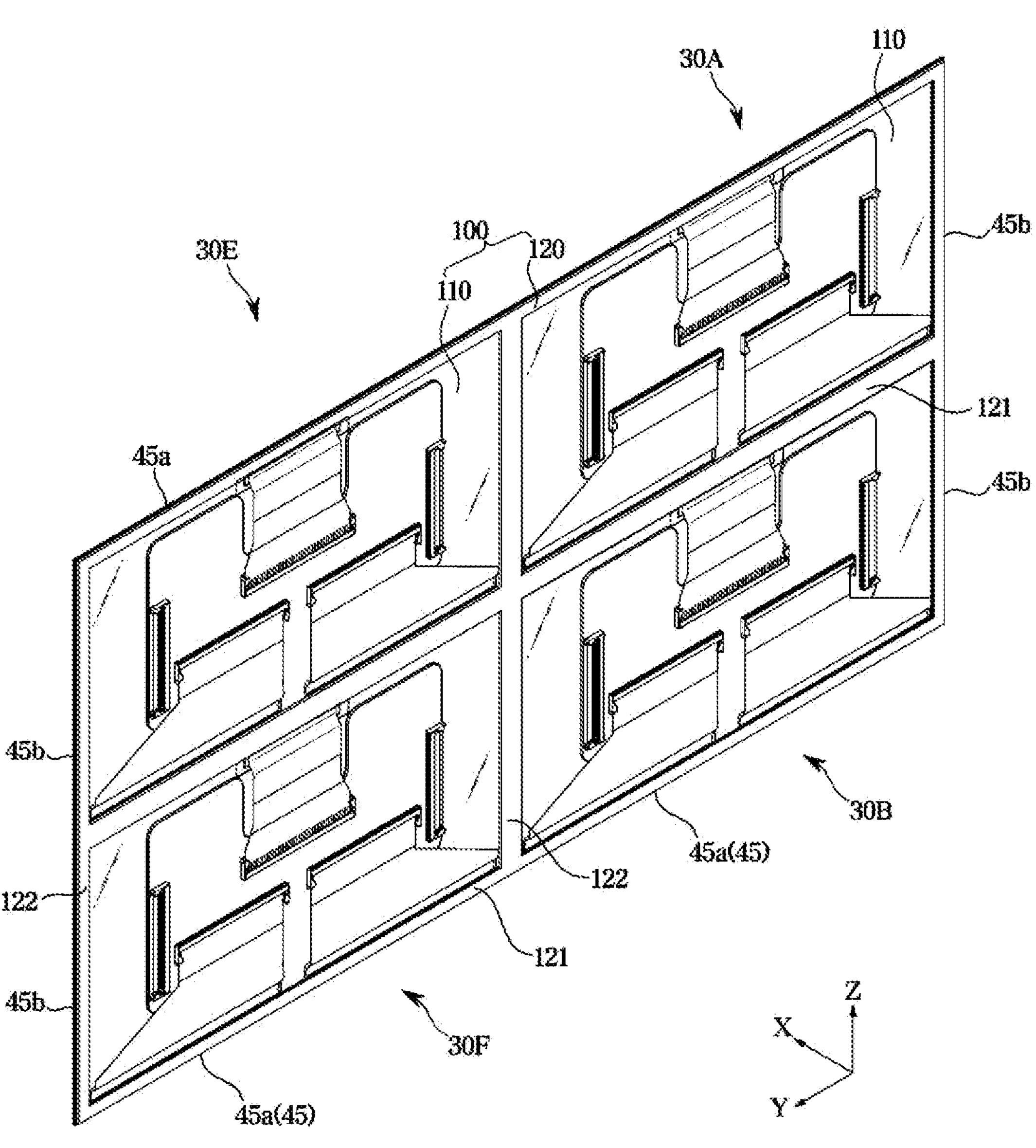
FIG. 5 is a rear perspective view illustrating a part of a display panel of the display device shown in FIG. 1.
Figure 6:
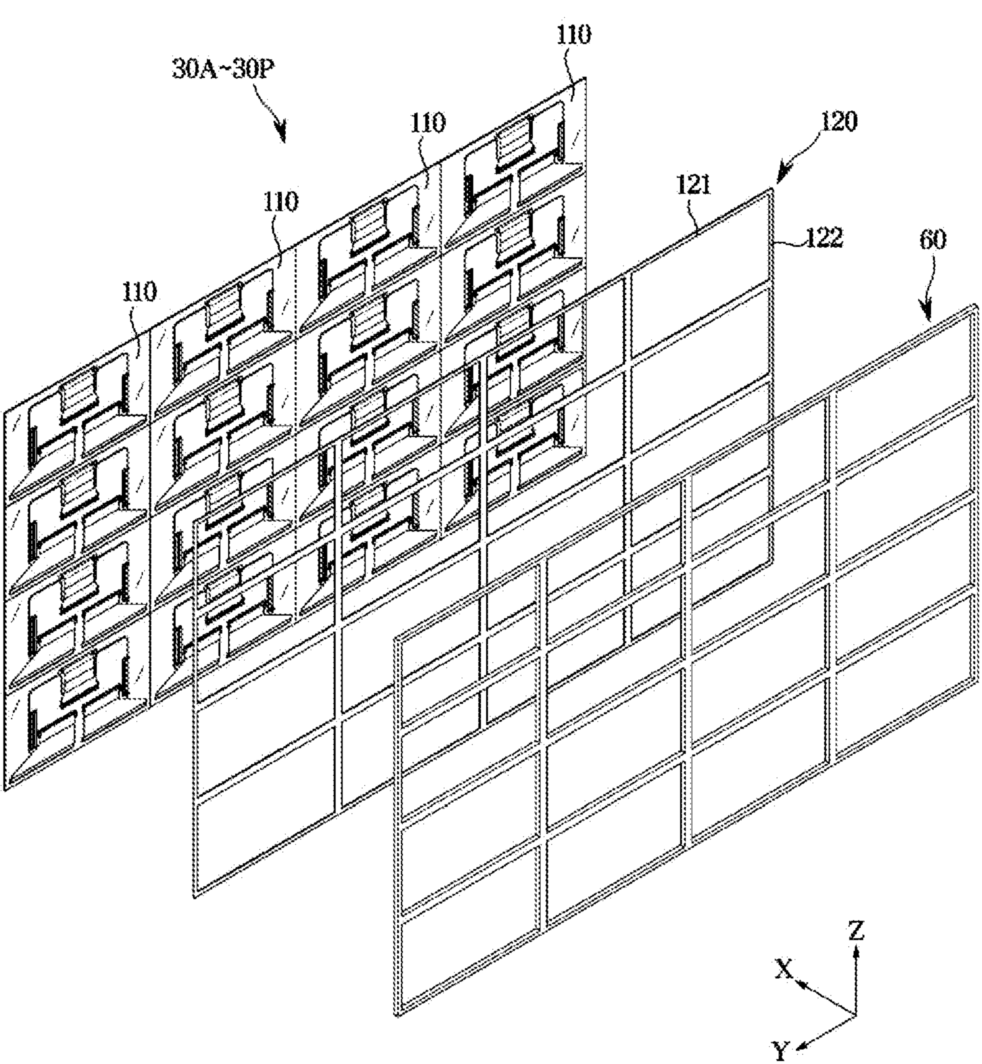
FIG. 6 is an exploded view of the main configuration of the display device shown in FIG. 1, which is viewed from behind.
Figure 7:
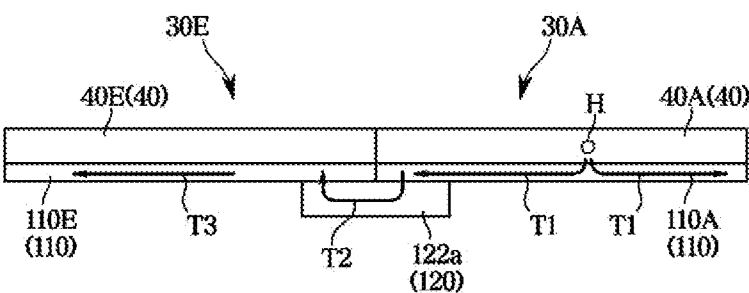
FIG. 7 is a cross-sectional view schematically illustrating a state in which heat is transferred in a part of the display device shown in FIG. 1.
Figure 7:
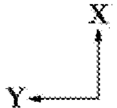
Figure 8:
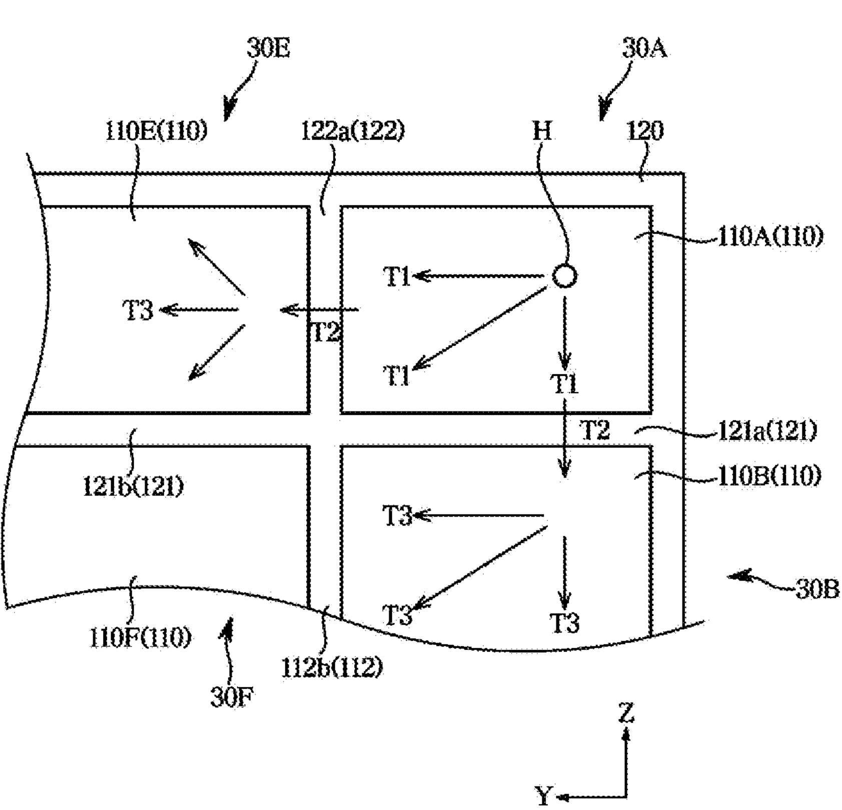
FIG. 8 is a view schematically illustrating a state in which heat is transferred in a part of the display device shown in FIG. 1, which is viewed from behind.

FIG. 5 is a rear perspective view illustrating a part of a display panel of the display device shown in FIG. 1, FIG. 6 is an exploded view of the main configuration of the display device shown in FIG. 1, which is viewed from behind, FIG. 7 is a cross-sectional view schematically illustrating a state in which heat is transferred in a part of the display device shown in FIG. 1, and FIG. 8 is a view schematically illustrating a state in which heat is transferred in a part of the display device shown in FIG. 1, which is viewed from behind;

As described above, in the display panel 20 of the display device 1 according to the embodiment of the disclosure, the plurality of inorganic light emitting diodes 50 themselves may form pixels, and have different power consumptions depending on an image displayed when configuring a display. Accordingly, heat generated from the plurality of inorganic light emitting diodes 50 may be different from each other.

In particular, since the red light emitting device 51 has a great, luminance variability of emitted light according to the temperature of the light emitting device itself, when heat concentration occurs in some areas on the display panel 20, the red light emitting device 51 on the heat concentration area may have a severely lowered luminance, and the uniformity of the screen of the display panel 20 may be degraded.

The non-uniformity due to the degradation in luminance of a portion of the screen may occur within each of the plurality of display modules 30A-30P and may occur between the plurality of display modules 30A-30P and thus the reliability of the display device 1 may be lowered.

Accordingly, in the case of the display device 1 in which the plurality of inorganic light emitting diodes 50 themselves form pixels, not only heat generated from the plurality of display modules 30A-30P needs to be dissipated but also temperature in each of the plurality of display modules 30A-30P and between the plurality of display modules 30A-30P needs to be maintained constant.

In order to resolve the issue, the display device 1 according to the embodiment of the disclosure may include a heat dissipation member 100 provided to maintain a constant temperature in the plurality of display modules 30A and 30P and between the plurality of display modules 30A-30P.

The heat dissipation member 100 may include module heat dissipation members 110, respectively, bonded to the rear surfaces of the substrates 40 of the plurality of display modules 30A-30P.

The heat dissipation member 100 may include a panel heat dissipation member 120 disposed at the rear end of the display panel 20 and connecting the respective module heat dissipation members 110 to dissipate heat between the module heat dissipation members 110 of the plurality of display modules 30A-30P.

The module heat dissipation member 110 may be provided to dissipate heat generated from the substrate 40 as described above.

The heat generated from the substrate 40 may be regarded as the sum of heat transferred from components in the substrate 40 including the plurality of inorganic light emitting diodes 50 and heat from the outside of the substrate 40.

Since the heat generated from the plurality of inorganic light emitting diodes 50 accounts for the largest portion of the heat generated from the substrate 40, the heat generated from the substrate 40 or the plurality of display modules 30A-30P described below may be described based on heat transferred from the plurality of inorganic light emitting diodes 50 to the substrate 40.

However, as described above, the meaning of heat generated from the substrate 40 is considered the sum of the heat generated from the plurality of inorganic light emitting diodes 50, the heat transferred from components disposed on the substrate 40, and the heat from the outside of the substrate 40.

When heat is generated at a certain point in the second direction Y or the third direction Z on the substrate 40, the heat is considered as heat, which is generated from some inorganic light emitting diodes 50 among the plurality of inorganic light emitting diodes 50 which are disposed at a position corresponding, in the first direction X, to the certain point on the substrate 40 in the second direction Y or the third direction Z and then transferred to the substrate 40.

In detail, the heat is the sum of heat generated from some inorganic light emitting diodes 50 among the plurality of inorganic light emitting diodes 50 which are disposed at a position corresponding, in the first direction X, to the certain point on the substrate 40 in the second direction Y or the third direction Z, and heat introduced to the certain point, which is generated from other component on the substrate 40 and the outside of the substrate 40.

That is, when high temperature heat is generated at a certain point on the substrate 40, it may be considered a high temperature heat may be generated by some inorganic light emitting diodes 50 among the plurality of inorganic light emitting diodes 50 which are disposed at a position corresponding to the certain point in the first direction X and transferred to the certain point.

However, the disclosure is not limited thereto, and high temperature heat generation may occur at a certain point of the substrate 40 not only by high temperature heat generated from some inorganic light emitting diodes 50 among the plurality of inorganic light emitting diodes 50 which are disposed at a position corresponding to the certain point of the substrate 40 in the first direction X, but also by heat introduced to the certain point on the substrate 40, which is generated from other components on the substrate 40 and the outside of the substrate 40.

Even when heat generated from other components on the substrate 40 and the outside of the substrate 40 is provided to some inorganic light emitting diodes 50 among the plurality of inorganic light emitting diodes 50 which are disposed at a position corresponding to a certain point of the substrate 40 in the first direction X, high temperature heat may be generated in the some inorganic light emitting diodes 50 among the plurality of inorganic light emitting diodes 50 not because of heat emission, and the high temperature heat may be transferred to the certain point of the substrate so that high temperature heat may be generated on the certain point of the substrate 40.

However, the following description is made based on a case in which high temperature heat is generated at a certain point on the substrate 40 when high temperature heat is generated from some of the inorganic light emitting diodes disposed at a position corresponding, in the first direction X, to the certain point and is transferred to the certain point on the substrate 40.

The module heat dissipation member 110 may allow the heat generated from the substrate 40 to be first transferred in a direction opposite to the first direction X simultaneously in the second direction Y or the third direction Z. Accordingly, even when high temperature heat is transferred to a portion of the module heat dissipation member 110 in the direction opposite to the first direction X, the heat may be evenly transferred to the entire area of the module heat dissipation member 110. Accordingly, the module heat dissipation member 110 may be formed in thermal equilibrium in the second direction Y and the third direction Z.

As the module heat dissipation member 110 is formed in thermal equilibrium, the substrate 40 in contact with the module heat dissipation member 110 may be evenly supplied with heat in a plane direction over the entire area, so that the substrate 40 may also be formed in thermal equilibrium.

In detail, heat generated from a portion of the substrate 40 is transferred to the heat dissipation member 110 in the direction opposite to the first direction X and then all over the module heat dissipation member 110, finally moving back to the entire area of the substrate 40 in the direction X.

Accordingly, the temperature of the entire substrate 40 is kept constant, and luminance degradation due to temperature may not occur in some regions.

That is, the module heat dissipation member 110 may allow heat introduced from the substrate 40 to move from the substrate 40 in a direction opposite to the first direction X, and additionally allow the heat to be rapidly spread in the second direction Y or the third direction Z.

Thereafter, the heat, generated from the portion of the substrate 40, may allow the module heat dissipation member 110 to reach a thermal equilibrium state, and then move back to the substrate 40. In this case, the heat of a uniform temperature over the entire area of the module heat dissipation member 110 may be transferred back to the substrate 40 in the first direction X, and thus the temperature of the substrate 40 may be kept uniform in the second direction Y or the third direction Z.

Thereafter, heat in thermal equilibrium over the entire area of the substrate 40 may be evenly transferred to all over the plurality of inorganic light emitting diodes 50 mounted on the substrate 40.

Accordingly, even when heat generation is concentrated on some of the plurality of inorganic light emitting diodes 50, the heat may be evenly transferred to the plurality of inorganic light emitting diodes 50 with respect to the first direction X in the substrate 40. Accordingly, the plurality of inorganic light emitting diodes 50 may maintain a substantially uniform temperature, and the luminance of light generated from the plurality of inorganic light emitting diodes 50 may be kept constant.

The module heat dissipation member 110 may be formed of a material having high thermal conductivity. For example, the module heat dissipation member 110 may be formed of a metal material, such as aluminum or copper. In addition, the module heat dissipation member 110 may be formed of a graphite material.

Accordingly, the module heat dissipation member 110 may easily spread heat in the second direction Y or the third direction Z through heat conduction.

It is appropriate that the module heat dissipation member 110 is provided as a vapor chamber. The vapor chamber may be provided in a plate shape corresponding to the substrate 40, and may rapidly transfer heat in the second directions Y or the third direction Z through evaporation and condensation processes.

Referring to FIGS. 5 and 6, the panel heat dissipation member 120 may be disposed behind the module heat dissipation members 110 of the plurality of display modules 30A-30P in the direction opposite to the first direction X.

The panel heat dissipation member 120 may be provided to be in contact with each of the module heat dissipation members 110 of the plurality of display modules 30A-30P.

The panel heat dissipation member 120 may include first regions 121 extending in the second direction Y and covering upper and lower side surfaces 45*a* of each of the plurality of display modules 30A-30P in the direction opposite to the first direction X and second regions 122 extending in the third direction Z and covering left and right side surfaces 45 of each of the plurality of display modules 30A-30P in the direction opposite to the first direction X.

The first region 121 and the second region 122 may be provided in a shape of a plurality of ribs orthogonal to each other in the second direction Y and the third direction Z.

Accordingly, rear portions of the four edges of the module heat dissipation member 110 of each of the plurality of display modules 30A-30P may be provided to be in contact with the first regions 121 and the second regions 122.

The plurality of display modules 30A-30P include a first display module 30A, a second display module 30E arranged in parallel with the first display module 30A in the second direction Y, a third display module 30B disposed in parallel with the first display module 30A in the third direction Z, and a fourth display module 30F disposed in parallel with the third display module 30B in the second direction Y.

For example, the first regions 121 of the panel heat dissipation member 120 may cover upper and lower side surfaces of the module heat dissipation members 110 corresponding to the upper and lower side surfaces 45*a* of the first, second, third, and fourth display modules 30A, 30E, 30B, and 30F in the first direction X.

In addition, the second regions 122 of the panel heat dissipation member 120 may cover left and right side surfaces of the module heat dissipation members 110 corresponding to the left and right side surfaces 45*b* of the first, second, third, and fourth display modules 30A, 30E, 30B, and 30F in the first direction X.

Accordingly, the panel heat dissipation member 120 may be provided to be connected to all of the module heat dissipation members 110 of the plurality of display modules 30A-30P.

The panel heat dissipation member 120 may be provided to, when the amounts of remaining heat are different between the module heat dissipating members 110 of the plurality of display modules 30A-30P, transfer heat between the module heat dissipation members 110 such that each of the module heat dissipating members 110 of the plurality of display modules 30A-30P reaches thermally equilibrium.

That is, among the module heat dissipation members 110 of the plurality of display modules 30A-30P, heat is transferred from a module heat dissipation members 110 to a module heat dissipation member 110 adjacent thereto through the panel heat dissipation member 120 so that all of the module heat dissipation members 110 of the plurality of display modules 30A-30P are gradually brought to thermally equilibrium. This will be described below in detail.

The panel heat dissipation member 120 may be bonded to the module heat dissipation members 110 by an adhesive tape. However, it is not limited thereto, and the panel heat dissipation member 120 may be bonded to the module heat dissipation members 110 through various methods.

The panel heat dissipation member 120 may be provided to be in contact with the plurality of display modules 30A-30P in the first direction X as described above, and provided to be in contact with the frame 60 in the direction opposite to the first direction X.

The panel heat dissipation member 120 may be provided in a shape corresponding to the frame 60 in the first direction X.

The panel heat dissipation member 120 may be formed of a material having high thermal conductivity. The panel heat dissipation member 120 may be formed of a metal material.

It is appropriate that the panel heat dissipation member 120 is formed of a metal material having a thermal expansion coefficient corresponding to that of the substrate 40. The panel heat dissipation member 120 may be formed of a nickel alloy.

As described above, 30A-30P the panel heat dissipation member 120 may be bonded to the plurality of display modules 30A-30P at a front side thereof and bonded to the frame 60 at a rear side thereof.

Accordingly, the panel heat dissipation member 120 may be disposed between the plurality of display modules 30A-30P and the frame 60 in the first direction X.

That is, since the plurality of display modules 30A-30P are directly bonded to the panel heat dissipation member 120, the panel heat dissipation member 12 needs to have a thermal expansion coefficient value corresponding to the thermal expansion coefficient value of the substrate 40 in order to maintain the separations formed between the plurality of display modules 30A-30P.

Since the thermal expansion coefficient of a nickel alloy is provided at a value corresponding to that of glass, it is appropriate that the panel heat dissipation member 120 is formed of a nickel alloy to prevent, separations between the display modules 30A-30P from irregularly varying even with heat generated in the plurality of display modules 30A-30P.

Accordingly, although separations between the plurality of display modules 30A-30P may occur because the frame 60 is formed of material having a thermal expansion coefficient different from that of the substrate 40, the separations may be prevented from irregularly varying using the panel heat dissipation member 120.

However, the nickel alloy is only one example of forming the panel heat dissipation member 120, and the disclosure is not limited thereto.

Unlike the embodiment of the disclosure, the panel heat dissipation member 120 may be formed as a part of the frame 60.

That is, the panel heat dissipation member 120 may be replaced with the front layer (not shown) of the frame 60 described above. In this case, the plurality of display modules 30A-30P may be provided to be directly bonded to the frame 60.

In detail, the plurality of display modules 30A-30P may be directly bonded to the front layer (not shown) of the frame 60. Since the front layer (not shown) is provided in the same form as the panel heat dissipating member 120, the front layer (not shown) may transfer heat between the module heat dissipating members 110 of the plurality of display modules 30A-30P, and prevent separations between the plurality of display the modules 30A-30P, although they may occur, from irregularly varying.

Hereinafter, characteristics of heat transfer from the module heat dissipation member 110 and the panel heat dissipation member 120 will be described in detail.

As shown in FIGS. 7 and 8, when heat of high temperature is generated at a certain point (hereinafter referred to as a hot spot H) of the substrate 40A of the first display module 30A, the heat may be transferred to a first module heat dissipation member 110A of the first display module 30A corresponding to the hot spot H in the direction opposite to the first direction X.

As described above, the hot spot H is a point of the substrate 40 to which heat generated from inorganic light emitting diodes 50 disposed at a position corresponding thereto in the first direction X, and the point may be formed as some inorganic light emitting diodes 50 among a plurality of inorganic light emitting diodes generate a larger amount of heat than other inorganic light emitting diodes.

As described above, the high temperature heat may be generated in the hot spot H not only by heat generated from some inorganic light emitting diodes 50 among the plurality of inorganic light emitting diodes 50 which are disposed at a position corresponding to the hot spot H in the first direction X but also by other factors. However, the following description will be made based on heat generated from some inorganic light emitting diodes 50 among the plurality of inorganic light emitting diodes 50 which are disposed at a position corresponding to the hot spot H in the first direction X as an example.

The high temperature heat transferred in the direction opposite to the first direction X may be spread (T1) in the second direction Y and the third direction Z on the first module heat dissipation member 110A. Accordingly, the first module heat dissipation member 110A may reach thermal equilibrium. Accordingly, a difference in luminance of the display screen, which may be caused by a difference in temperatures inside the first display module 30A, may be reduced.

In this case, since the hot spot H is generated only on the first display module 30A, the first display module 30A may have heat remaining at a higher temperature than those of the second display module 30E and the third display module 30B adjacent to the first display module 30A.

Accordingly, the luminance of the display screen displayed on the first display module 30A may be lower than those of the second display module 30E and the third display module 30B.

However, the high temperature heat remaining in the first module heat dissipation member 110A may be transferred to the second module heat dissipation member 110E of the second display module 30E and the third heat dissipation member 110B of the third display module 30B by the panel heat dissipation member 120.

In detail, the high temperature heat remaining in the first module heat dissipation member 110A may be conducted (T2) to the second module heat dissipation member 110E through a first portion 122*a* of the second region 122 disposed between the first display module 30A and the second display module 30E.

In addition, the high temperature heat remaining in the first module heat dissipation member 110A may be conducted to the second module heat dissipation member 110E through the first region 121 and transferred to the second module heat dissipation member 110E.

By the high temperature heat transferred from the first module heat dissipation member 110E to the second module heat dissipation member 110E through the panel heat dissipation member 120, only a partial area of the second module heat dissipation member 110E has the high temperature heat, which may cause the second module heat dissipation member 110E to lose temperature balance.

In this case, heat from the high temperature area on the second module heat dissipation member 110E spreads (T3) inside the second module heat dissipation member 110E so that thermal equilibrium is reached inside the second module heat dissipation member 110E. Accordingly, each of the first module heat dissipation member 110A and the second module heat dissipation member 110E may reach thermal equilibrium at the same temperature.

Similarly, the high temperature heat remaining in the first module heat dissipation member 110A may be conducted (T2) to the third module heat dissipation member 110B through a first portion 121*a* of the first region 121 disposed between the first display module 30A and the third display module 30B.

In addition, the high temperature heat remaining in the first module heat dissipation member 110A may be conducted to the third module heat dissipation member 110B through the second region 122 and transferred to the third module heat dissipation member 110B.

By the high temperature heat transferred from the first module heat dissipation member 110E to the third module heat dissipation member 110B through the panel heat dissipation member 120, only a partial area of the third module heat dissipation member 110B has the high temperature heat, which may cause the third module heat dissipation member 110B to lose temperature balance.

In this case, heat from the high temperature area on the third module heat dissipation member 110B spreads (T3) inside the third module heat dissipation member 110B so that thermal equilibrium is reached inside the third module heat dissipation member 110B. Accordingly, each of the first module heat dissipation member 110A and the third module heat dissipation member 110B may reach thermal equilibrium state at the same temperature.

Similarly, heat may be transferred to the fourth display module 30F disposed between the second display module 30E and the third display module 30B.

The high temperature heat remaining in the second module heat dissipation members 110E and the third module heat dissipation member 110B may be conducted to the fourth module heat dissipation member 110F through a second portion 121*b* of a first region 121 disposed between the second display module 30E and the fourth display module 30F, and a second portion 122*b* of a second region 122 disposed between the third display module 30B and the fourth display module 30F.

As described above, heat may be conducted to the display modules adjacent to the first display module 30A, and each of the display modules gradually reaches thermal equilibrium, allowing all of the plurality of display modules 30A-30P to reach thermal equilibrium, and thus degradation in luminance due to temperature imbalance between the display modules 30A-30P may be reduced.

Although the technical aspects of the disclosure have been shown by specific embodiments, it should be understood that there is no intention to limit the disclosure to the particular forms disclosed, rather the disclosure is to cover all modifications, equivalents, and alternatives falling within the spirit and scope of the disclosure.

What is claimed is:

1. A display device comprising:

a display panel comprising a plurality of display modules arranged in parallel with each other in a M*N matrix form, wherein each of the plurality of display modules comprises:

a substrate comprising a mounting surface on which a plurality of inorganic light emitting diodes are mounted and a rear surface arranged on a side opposite of the mounting surface, and a module heat dissipation member in contact with the rear surface of the substrate to dissipate heat generated from the substrate, wherein the module heat dissipation member comprises four edges corresponding to four edges of the substrate, wherein the display panel further comprises a panel heat dissipation member connecting the module heat dissipation members of the plurality of display modules to dissipate heat from the module heat dissipation members of the plurality of display modules, wherein the panel heat dissipation member is formed to extend along the four edges of each of adjacent module heat dissipation members and to contact and connect the adjacent module heat dissipation members, wherein the display device further comprises a frame to support the plurality of display modules such that the plurality of display modules are arranged in parallel with each other in the M*N matrix form, and wherein a rear surface of the panel heat dissipation member is in contact with the frame at each edge of the four edges of each substrate.

2. The display device of claim 1, wherein the module heat dissipation member is a metal material.

3. The display device of claim 1, wherein the module heat dissipation member is a vapor chamber.

4. The display device of claim 1, wherein the panel heat dissipation member is a metal material.

5. The display device of claim 4, wherein the panel heat dissipation member is formed of a nickel alloy.

6. The display device of claim 1, wherein a thermal expansion coefficient of the panel heat dissipation member is a value substantially corresponding to a thermal expansion coefficient of the substrate.

7. The display device of claim 1, wherein the panel heat dissipation member supports the plurality of display modules.

8. The display device of claim 1, wherein the module heat dissipation member is provided such that high temperature heat generated at one point of the substrate is transferred to an area of the substrate in a direction parallel to the substrate for the substrate to be maintained in thermal equilibrium in the direction parallel to the substrate.

9. The display device of claim 1, wherein the substrate has an area at least larger than or equal to an area of the module heat dissipation member.

10. The display device of claim 1, wherein the plurality of display modules further comprises a first display module comprising a first substrate, and a second display module disposed in parallel with the first display module comprising a second substrate, the module heat dissipation member comprises a first module heat dissipation member corresponding to the first display module and a second module heat dissipation member corresponding to the second display module, and the panel heat dissipation member is in contact with a rear surface of the first module heat dissipation member and a rear surface of the second module heat dissipation member.

11. The display device of claim 10, wherein the panel heat dissipation member is configured to, when an amount of heat remaining in the first module heat dissipation member due to the first substrate is greater than an amount of heat remaining in the second module heat dissipation member due to the second substrate, transfer heat from the first module heat dissipation member to the second module heat dissipation member such that the first module heat dissipation member and the second module heat dissipation member reach thermal equilibrium.

12. The display device of claim 9, wherein the panel heat dissipation member covers all of the four edges of the module heat dissipation member of each of the plurality of display modules in a direction toward the rear surface.

13. The display device of claim 1, wherein a front surface of the panel heat dissipation member is in contact with the plurality of display modules.

14. The display device of claim 13, wherein a thermal expansion coefficient of the panel heat dissipation member is a value substantially corresponding to a thermal expansion coefficient of the substrate.

* * * * *